United States Patent [19]

Marx

[11] Patent Number: 4,782,287
[45] Date of Patent: Nov. 1, 1988

[54] WATT-HOUR METER

[75] Inventor: Thomas I. Marx, Hingham, Mass.

[73] Assignee: Sigma Instruments, Inc., Braintree, Mass.

[21] Appl. No.: 924,897

[22] Filed: Oct. 30, 1986

Related U.S. Application Data

[63] Continuation of Ser. No. 553,184, Nov. 18, 1983, abandoned.

[51] Int. Cl.$^4$ .................... G01R 21/06; G01R 11/00
[52] U.S. Cl. .................................. 324/142; 324/141; 340/637; G01R/21/06; G01R/11/00
[58] Field of Search ................ 324/142; 307/271, 261; 328/127; 340/637; 364/483

[56] References Cited

U.S. PATENT DOCUMENTS

| | | | |
|---|---|---|---|
| 3,461,392 | 8/1969 | Hughes et al. | 307/271 |
| 3,484,593 | 12/1969 | Schmoock et al. | 328/127 |
| 3,835,419 | 9/1974 | Milne et al. | 328/127 |
| 3,976,942 | 8/1976 | Mayfield | 324/142 |

Primary Examiner—Reinhard J. Eisenzopf
Assistant Examiner—Vinh P. Nguyen
Attorney, Agent, or Firm—Leo Stanger

[57] ABSTRACT

In a watt-hour meter pulse width modulated signals, representing the voltage supplied to a load, serve as chopping signals that modulates a waveform representing current to produce an output indicative of power. A series of pulses is spaced on the basis of the power signal and the number of pulses connected as a measure of energy.

7 Claims, 3 Drawing Sheets

WATT-HOUR METER

This is a continuation of application Ser. No. 533,184, filed Nov. 18, 1983, now abandoned.

BACKGROUND OF THE INVENTION

This invention relates to energy monitors and particularly to watt-hour meters.

Power companies generally use watt-hour meters to monitor the energy consumption in homes and businesses. Frequently a single watt-hour meter monitors the energy consumption of all the business tenants in a shopping center or the like and all the residential tenants of an apartment building. It is essential that such watt-hour meters be extremely accurate because charges are based upon the readouts of such meter devices. The owner or manager of the shopping mall or residential apartment normally pays for the entire energy consumption of all the tenants. The tenants are charged a flat fee which is included as part of their respective rents. However, some tenants consume portionally more energy than others. Thus, with rising fuel costs, owners, managers, and tenants who utilize only minimum quantities of energy wish to proportion the costs within any shopping center or apartment building on the basis of use. The cost of installing existing watt-hour meters for convenient reading is at the present time very expensive.

SUMMARY OF THE INVENTION

An object of the invention is to improve watt-hour meters.

Another object of the invention is to overcome the aforementioned difficulties.

Still another object of the invention is to provide an easily installed and remotely readable watt-hour meter.

The various features of novelty which characterize the invention are pointed in the claims. Other objects and advantages of the invention will become evident from the following detailed description when read in light of the accompanying drawings.

DETAILED DESCRIPTION OF PREFERRED EMBODIMENTS

Figure 1:
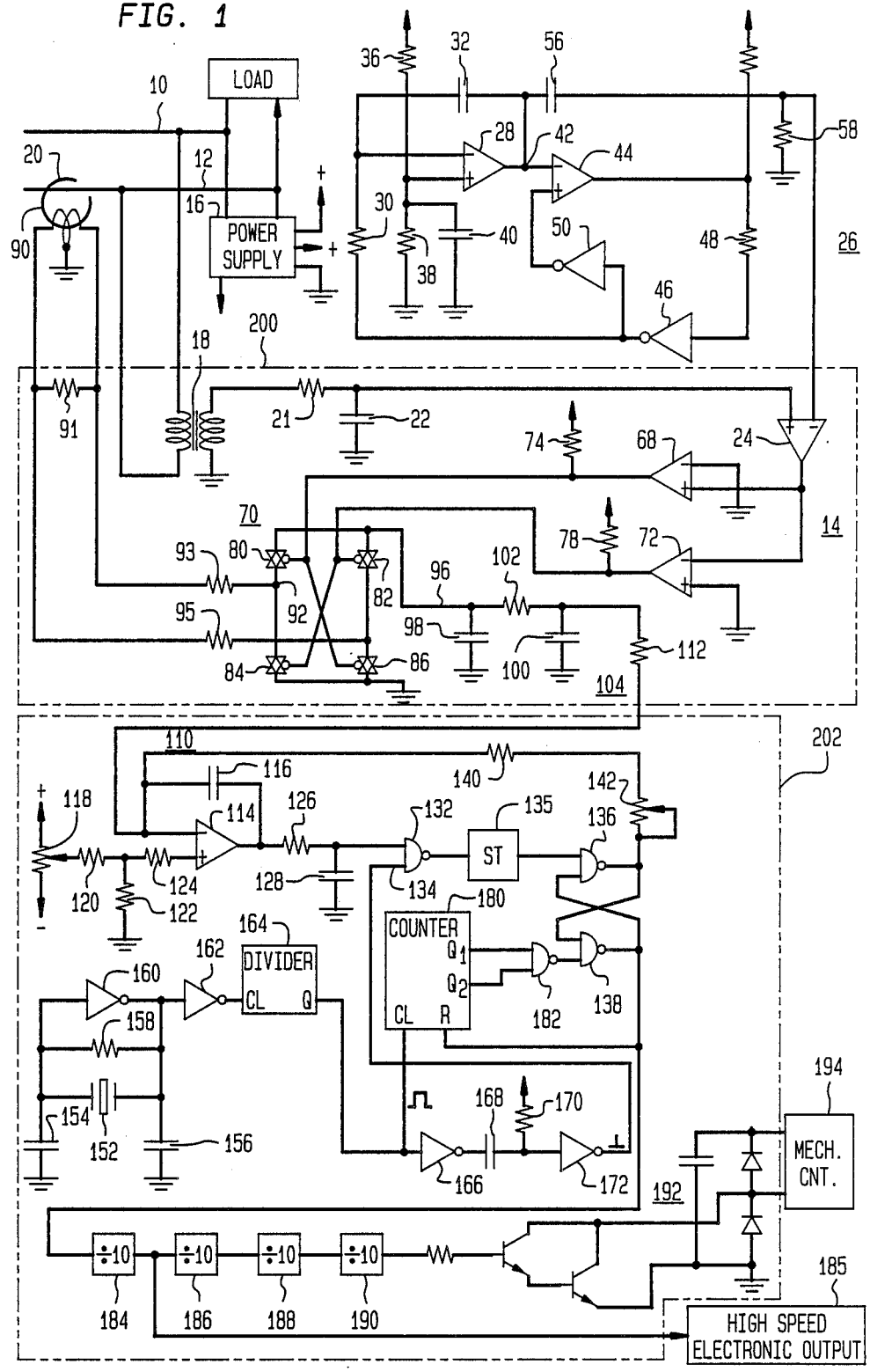
FIG. 1 is a schematic diagram of a watt-hour meter embodying features of the invention.

In FIG. 1, lines 10 and 12 carry the energy to be consumed by a load L and to be measured by the watt-hour meter 14 of the invention. The lines 10 and 12 provide the small amount of current for a power supply 16 that produces the voltages needed in the watt-hour meter. Typical voltages furnished by the supply 16 are +20 V, +12 V, −8 V, a +7 V reference and zero volts representing ground (used in the sense of common rather than earth). A voltage transformer 18 senses and reduces the voltage at the lines 10 and 12. A current sensor 20 senses the current in one of the lines 12. The phase shift introduced by the transformer 18 is made equal to the phase shift of current sensor 20 by a phase shifter composed of a variable resistor 21 and a capacitor 22. The sensed sinusoidal voltage is then applied to the non-inverting, or plus, or positive input of a comparator 24.

Figure 2:
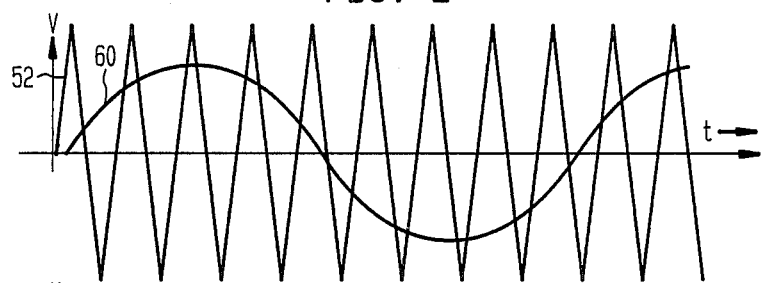
FIGS. 2 to 7 are respective graphs illustrating electrical conditions at various points of the watt-hour meter in FIG. 1.
Figure 3:
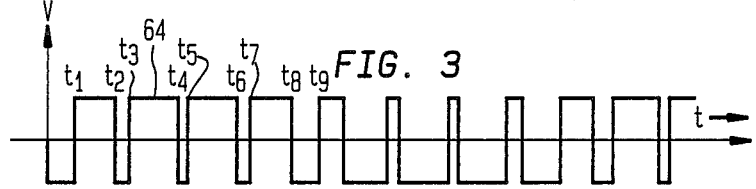

The inverting, or negative, or minus input of the comparator 24 receives the output of a non-synchronous triangular waveform generator 26. It compares the sinusoidal input with the triangular input as shown in FIG. 2 to provide a time-modulated pulse sequence as shown in FIG. 3.

In the generator 26, an operational integrator is composed of an amplifier 28, an input resistor 30, a feedback capacitor 32, two voltage dividing resistors 36 and 38 which are equal to each other within one percent, and a capacitor 40. When the supply voltage to the voltage divider resistors 36 and 38 is 7 volts the common connecting point of these resistors establishes a 3.5 volt level at the non-inverting input of the amplifier 28. The feedback capacitor 32 and the input resistor 30 are connected to the inverting input of the amplifier 28. When the input to the resistor 30 is higher than voltage established by the voltage dividing resistors 36 and 38 at the non-inverting input of the amplifier 28, the output of the integrating circuit declines.

A comparator 44 senses the declining output of integrator 28 at the output 42 with its inverting input. As long as the declining output at 42 is higher than the voltage at the non-inverting input of the comparator 44 the latter's output is low. An inverter 46 reverses this low. A resistor 48 is used only to limit inverse current into 46 to maintain the high at the input resistor 30. An inverter 50 between the inverter 46 and the non-inverting input of the comparator 44 reverses the high and produces a low at the non-inverting input of the comparator 44. Inverters 46 and 50 are CMOS type, and they exhibit very low output offset voltages in both the logic high and low states.

When the declining voltage at the output 42 falls below the low at the non-inverting input of the comparator 44, the latter flips over and produces a high which the inverters 46 and 50 now maintain at the non-inverting input of the comparator 44. The inverter 46 responds to the high at the comparator 44 and produces a low at the input resistor 30 of the operational integrator. The latter now produces a rising voltage at output 42. The voltage at output 42 continues to rise until it exceeds the high at the non-inverting input or comparator 44 which then again flips over to produce a low. The two inverters 46 and 50 now again set the non-inverting input of comparator 44 to low and the resistor 30 at the input of the operation integrator of amplifier 40 again to high. The output 42 of the operational integrator now again declines. The comparator 44 keeps reversing the input to the operational integrator in response to the latter's output reaching particular limit levels. The resulting triangular voltage, shown by the curve 52 in FIG. 2, is extremely linear, and its peak-to-peak swing is as stable as the supply voltages applied to the comparators 46 and 50.

A coupling circuit composed of a capacitor 56 and a resistor 58 applies the triangular voltage at the output 42 of the operational integrator to the inverting input of the comparator 24. The sinusoidal input to the non-inverting input of the comparator 24 is identified in FIG. 2 as 60. The peak values of the sinusoidal voltage are set by the transformer 18, and the peak values of the triangular voltage are established so as to be higher than the highest sinusoidal voltage.

When the instantaneous value of the triangular voltage at the inverting input of the comparator 24 exceeds the instantaneous sinusoidal voltage at the non-inverting input of the comparator 24, the output of the comparator 24 goes low as shown at 62 in FIG. 3, which is a graph of the output of the comparator 24. When the instantaneous sinusoidal voltage at the non-inverting input of the comparator 24 exceeds the instantaneous triangular voltage at its inverting input the output of the comparator 24 goes high as shown by the levels 64 in FIG. 3. Thus, the output of the comparator 24 represents, with its positive pulses, a graph of the times during which the sinusoidal voltage exceeds the triangular voltage. As such, it is a pulse-width modulated output, where zero input voltage is represented by 50% duty cycles.

The slope of operational integrator with its amplifier 28 is set by the capacitor 32 and the resistor 30 to produce triangular wave form at approximately ten times the frequency of the sinusoidal waveform which would normally be 60 Hz.

A non-inverting comparator 68 shapes and applies the pulse output shown in FIG. 3 from the comparator 24 to a modulator or chopper 70. An inverting comparator 72 inverts and sharpens the output of the comparator 24 and applies it to the opposite terminal of the input of the chopper 70. Two 10 K resistors 74 and 78 respectively connect the open collection outputs of the comparators 68 and 72 to positive potential so that the pulses from the amplifier 68 and 72 shift between the levels shown in FIG. 3.

In the chopper 70 CMOS analog switches 80, 82, 84 and 86 normally exhibit high resistances such as many megohms. However, in response to positive signals with respect to a predetermined value $V_{SS}$ the resistances are reduced to value such as hundred of ohms. The CMOS analog switches 80, 82, 84 and 86 form a bridge circuit which receives an input representing current in the lines 10 and 12 being measured. The sensor 20 measures the current in one of the lines 10 and 12 with a toroidal coil 90 surrounding the line 12 and magnetically coupled to the line 12 to operate as a current transformer with the line 12. The output of the toroidal coil 90 is loaded with a resistor 91, and is a sinusoidal voltage. Two resistors 93 and 95 apply the sinusoidal current-representing voltage to center points 92 and 94 of the arms of the bridge 70.

The output of the bridge 70 appears at a line 96 and is filtered by a filter system composed of two shunt capacitors 98 and 100 and a series resistor 102.

Figure 4:
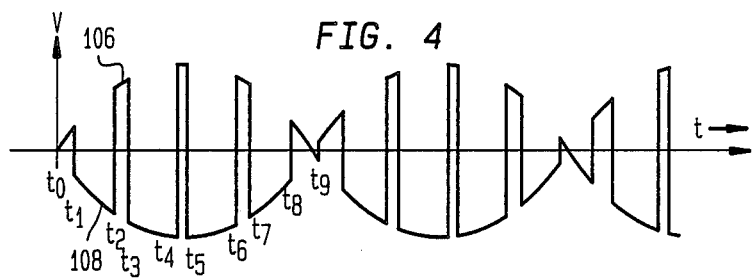
Figure 5:
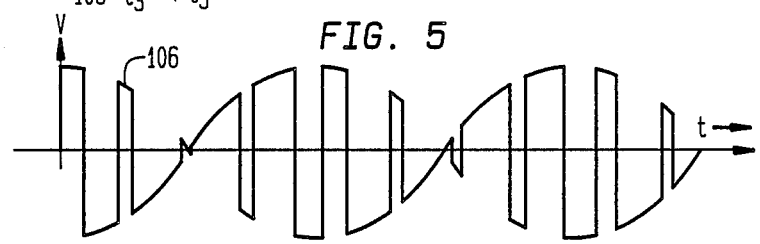

FIGS. 4 and 5 illustrate outputs as they would appear on the line 96 in the unfiltered state. FIG. 4 illustrates the condition when the current at the lines 10 and 12 is in phase with the voltage, and FIG. 5 illustrates the output at line 96 when the current is 90 degrees out of phase with the voltage.

In FIG. 4, the output of the toroidal coil 90 is more positive at the bridge-arm center point 92 than the center point 94, from the time t0 to t1. In this interval, during the times t1 to t2, t3 to t4, t5 to t6, and t7 to t8, the comparator 68 produces a positive pulse while the output of the inverting comparator 72 is negative. This turns off the CMOS analog switches 80 and 86 while the switches 84 and 82 turn on. Hence, during the intervals t1 to t2, t3 to t4, t5 to t6, t7 to t8, etc., the output at line 96, prior to filtering, follows the negative sinusoidal path 108 of the right side of toroidal coil 90. During the periods t0 to t1, t2 to t3, t4 to t5, t6 to t7, etc., the output of the comparator 72 follows the positive sinusoidal path 108. As a result, line 96, before filtering, carries a chopped sinusoidal voltage.

As can be seen, during the first half of the sinusoidal cycle of the voltage in FIG. 1, the sinusoidal voltage exceeds the triangular voltage during a large proportion of the half cycle. Long positive pulses occur at the output of the comparators 24 and 68 as shown in FIG. 3. During the negative half cycle of the input voltage at the lines 10 and 12, the sinusoidal voltage exceeds the triangular voltage only a small proportion of the time. Hence, during the second half cycle positive pulses of only short duration occur at the output of the comparator 24 and the output of amplifier 68. Because FIG. 4 illustrates the output at the line 96, prior to filtering, for a current sensed by the toroidal coil 90 in phase with the voltage at the lines 10 and 12, the proportion of the first sinusoidal half cycle which follows the reversed sinusoidal path is large. In the succeeding negative half cycle the shorter positive pulses at the output of comparator 68 and the longer positive pulses at the output of the comparator 72 produce an output at the line 96, if viewed unfiltered. The filtered output caused by filtering with the capacitors 98 and 100 and resistor 102 represents the average value of the waveform in FIG. 4 and constitutes a negative voltage.

When the current is 90 degrees out of phase with the voltage at the lines 10 and 12, as shown in FIG. 5, the d.c. average of the positive and negative half cycles at the line 96 before filtering, are on average substantially equal or symmetrical about ground. This is so because the pulse pattern in FIG. 3 is substantially symmetrical about the peak and the bottom of each positive and negative half cycle. Hence, when the current is 90 degrees out of phase with the voltage, the first two quarter cycles of the current vary from peak through zero and to trough, while the voltage varies from zero to peak to zero the resulting output during the times t0 to t9, as well as during succeeding half cycles, in substantially symmetrical about ground or zero. The output as filtered by the filter components 98 to 104 produces a zero voltage.

Effectively, the voltage wave form is converted to a time value proportional to the voltage, and that is combined with the current wave form so the result is not only equal to voltage times current but is, in fact, equal to $-EI \cos \theta$, where $\theta$ is the phase angle between voltage and current. In the examples shown in FIGS. 4 and 5, if the voltage and current are in phase, the filtered output will be a maximum negative while when the voltage and current are at 90 degrees out of phase, the average value will be zero. The voltage has been effectively converted to time and the time multiplied by the current amplitude which averages out to an average value equal to $-EI \cos \theta$. Any portion of a signal that is 90° out of phase will result in zero Voltage D.C. contribution to the DC at line 96.

Figure 6:
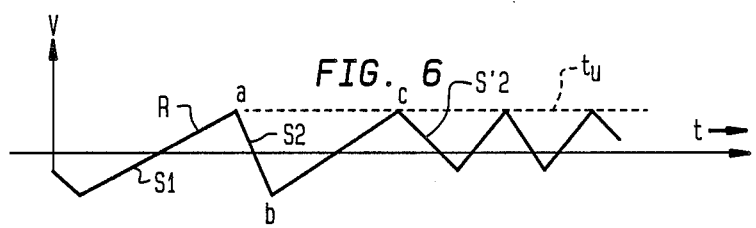

An operational integrator 110, composed of an input resistor 112, an amplifier 114, and a capacitor 116, integrates the $-EI \cos \theta$ output of the pi filter 104 relative to a value set at the non-inverting input of the amplifier 114. A potentiometer 118 between positive and negative sources such as +7.0 volts and −8 volts, a resistor 120, a grounded resistor 122, and a series resistor 124 establish the value at the non-inverting input of the comparator 114. They compensate for zero errors in circuits 70 and 110. The integrating output passes through a current-limiting series resistor 126 and passes by a noiseshunting capacitor 128 whose value is typically 100pf. The result is a ramp R with a slope S1 as shown in FIG. 6. The slope S1 is determined in part by the output of the voltage at the capacitor 100 and the value of capacitor 116. When the ramp of the integrated output reaches a sufficiently high value it enables a NAND gate 132 to go low in response to the next positive pulse at its input 134. The resulting output pulses from the NAND gate 132 decrease in amplitude with the rise in the ramp at comparator 114. This is so because NAND gate, inherently exhibits a residual analog characteristic within a limited range in response to gradually changing inputs at the transitional region. When the output pulses of NAND gate reach a low value equal to the lower threshold T1 of a Schmitt trigger 135 the latter produces a low. This occurs at a time (a) in FIG. 6.

The resulting output flips a latch or flip-flop composed of NAND gates 136 and 138 and produces a high at the output of gate 136. A resistor 140 and trimmer resistor 142 apply the high to the inverting input of the amplifier 114 and drain the capacitor 116 of the integrator 110 so as to cause the latter to work in the ramp down. That is, the pulse produces a decline with a slope S2 determined in part by the resistors 140 and 142, but limited in part by the output of the capacitor 100.

The pulses at the input 134 of the NAND gate 132 arrive from an osillator operating in a range of 3.5 MHz, and composed of a crystal 152, two capacitors 154 and 156, a resistor 158, and an inverter 160. An inverter 162 applies the inverse oscillator output to a counter 164 which divides the frequency by 512 (or $2^9$) and produces an accurate square wave output. An inverter 166, a series capacitor 168, a resistor 170 connected to a positive potential, and an invert 172 amplify, differentiate, and inverter the square waves from the counter 164 to generate the positive pulses at the input 134. The output of the counter 164 also clocks a counter 180 which is enabled at a reset terminal R by the gate 138 when the gate 132 flips the flip-flop 136, 138. NAND gate 182 produces an inverted pulse after a specified output count. The members 132, 136, 138, and 182 are preferably part of a single chip available as MC14093B from Motorola Semiconductor Products Inc., as shown in the Motorola book entitled "CMOS Integrated Circuits", published 1978. In this chip each gate includes a Schmitt trigger at its output for the purpose of producing sharp output pulses. Only the Schmitt trigger for gate 132 is shown. The other Schmitt triggers do not affect the logic function of the chip. However, each gate has two thresholds created by the Schmitt triggers.

Figure 7:
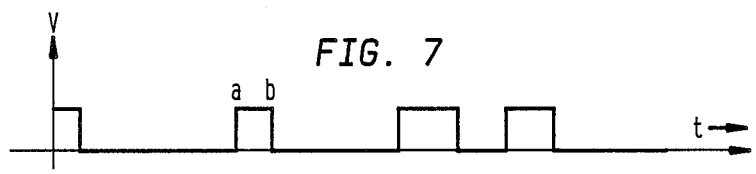

After counting a predetermined number of pulses from the counter 164, the gate 182 resets the flip-flop 136, 138. The high pulse appearing at the output of the gate 136 therefore remains at the non-inverting input of the amplifier 114 of the integrator 110 for a period of time equal to the predetermined number of pulses established by the counter 180 and the gate 182. That is, the flip-flop 136, 138 responds to being flipped by the gate 132 by remaining in one stable condition for a predetermined period of time regardless of any changes in the gate 132 or because the voltage appearing at the gate 138 from the counter 180 and the gate 182 prevents the flip-flop from being reversed. That is, the Schmitt trigger 135 and the pulses at the input 134 are unable to affect the flip-flop during the period that the counter 180 is counting the predetermined time period. A voltage low at the gate 182 at the end of the predetermined time period established by the counter 180 results in the flip-flop 136, 138 flipping and removing the high voltage from the input of the integrator 110. This immediately resets the counter 180 and the output of the gate 182 goes high to release the reset of the flip-flop so the latter is free to respond to the Schmitt trigger 135. This occurs at a time b in FIG. 6. The integrator 110 again begins integrating with a slope determined by the voltage at the capacitor 100 until it reaches the sensitivity of the gate 132, and until the pulses from gate 132 reach the lower threshold T1. The Schmitt trigger 135 then again flips the flip-flop 136, 138 at the time c in FIG. 6. This initiates the counting in the counter 180. The high output pulse of the gate 136 again creates the decline at the slope S2 in FIG. 6. The resulting output of the flip-flop at the gate 136 is shown in FIG. 7. The output of gate 138 is the reciprocal of that shown in FIG. 7.

The time of the rise in the integrator 110, namely, the pulses of FIG. 6, are inversely proporational to EI cos $\theta$, namely, the number of watts. On the other hand, the wider the spaces between the pulses, the lower the repetition rate of the pulses and spaces in FIG. 7. The narrower the spaces the greater the repetition rate. Hence, the repetition rate of the pulses is proportional to the number of watts. The total number of pulses or spaces therefore represents the total energy.

The total number of pulses from the gate 138 which is equal to the number of pulses at gate 136, is counted and divided by ten in a counter 184 and then applied to a high speed electronic output 185. This high speed electronic output may be remotely located from the meter itself. Divide-by-ten counter 186, 188, and 190 further divide the rate by 1,000 and apply them to Darlington circuit 192 which operates a mechanical counter 194 whose output represents the total energy being consumed. The latter may also be remotely located.

If the real power consumed is substantially zero, the voltage at the capacitor 100 remains substantially zero, the integrator 110 produces substantially no rise in its output voltage but may slowly drift to the upper threshold level Tu of the Schmitt trigger 135 and the lower saturation voltage of amplifier 114. In the rate instances that the drift reaches the threshold level, the number of pulses created is sufficiently small to be insignificant in the high speed electronic output, and certainly not the mechanical counter after counting in the counters 184 to 190.

The accuracy of the system is enhanced by the use of CMOS technology in the members 46, 50, 70, and 136. The CMOS technology allow voltages to reach exact reference levels as the elements shift from one condition another.

The present invention provides an easily installed watt-hour meter. It requires no conductor rewiring. It can be made of small size, and because of its electronic nature may be remotely readable and registerable. Its output can be transmitted by wire or radio signals to a utility which can read the energy and/or direct the result into a computer for direct billing.

The on resistance of the chopper 70 is in hundreds of ohms requires high resistances 93 and 95. The inverting input of the amplifier 114 from the resistor 112 is always at virtual ground. The flip-flop 136, 138 pumps current into the inverting input. The current through the capacitor equals the net current through the summing point at the inverting input of amplifier 114. The sum of the currents through the summing point is always zero. The resistors 140 and 142 act as a current source to ground when the gate 136 is high. By passing current directly into the summing point at the negative input of the amplifier 114 from the comparatively high impedance of the resistors 93, 95, 103 and 112, it is possible to avoid a buffer. A constant temperature coefficient buffer would add significant expense to the circuitry.

Figure 8:
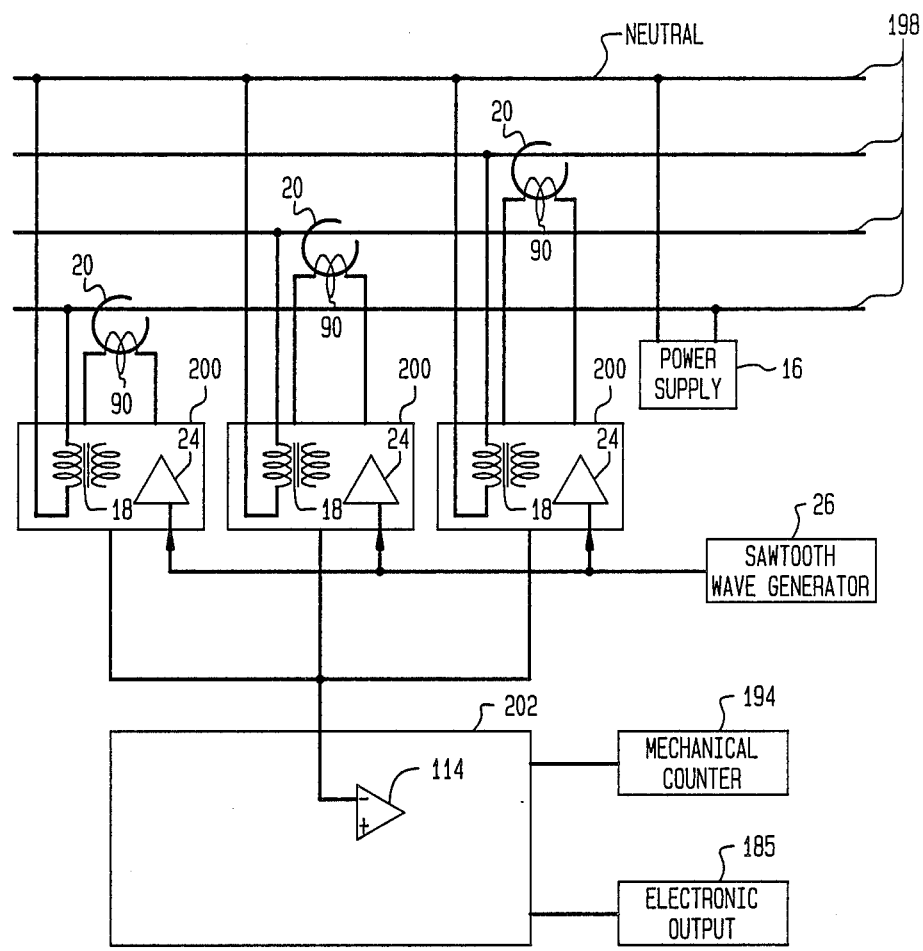
FIG. 8 is another embodiment of the invention.

The metering system of FIG. 1 can be used in a two or three phase measuring system. A three phase four-wire Y measuring system is shown in FIG. 8. Here, three current sensors 20 identical to the current sensor 20 in FIG. 1 sense the currents in the three lines of a three phase line 198. Each of the torodial coils 90 are used identically as that shown in FIG. 1 and processed by three separate circuits 200 each identical to the circuit identified as 200 in FIG. 1. The triangle waveform generator 26 of FIG. 1 is applied to three separate comparators 24 identical to that in FIG. 1. Furthermore, in each of the circuits 200 voltages are sensed by transformers 18 each identical to the transformer 18 in FIG. 1. The outputs of the three circuits 200 are applied to the summing point of the processing circuit identified as 202 in FIG. 1. This circuit drives the mechanical counter 194 and the electronic output 185 in the same manner as FIG. 1.

The circuits 200 each respond to separate currents and voltages and produce separate chopped outputs which are then filtered. The filtered outputs are then applied to the same summing point and thereby added to each other the resulting output represents the energy consumed in the three lines of the three phase system.

If only two phases of the three phase system are used, or if a three-wire delta power system is used, only two sensors 20 and two circuits 200 are needed. In the data system one of the wires is used as a common.

While the embodiments of the invention have been described in detail, it will be evident to those skilled in the art that the invention may be embodied otherwise without departing from its spirit and scope.

What is claimed is:

1. An energy meter for measuring energy as as function of power, comprising:
    pulse generating means for producing a pulse width modulated signal representing one component of power in the energy to be measured;
    chopper means responsive to another component of power in the energy to be measured for chopping the signals of the other component on the basis of the pulse width modulated signals and for smoothing the chopped signal;
    pulse forming means for producing a plurality of output pulses;
    spacing means coupled to said pulse forming means and said chopper means for spacing the output pulses of said pulse forming means in response to the output of said chopper means;
    counting means for counting the number of spaced pulses;
    said components being voltage and current;
    said chopper means including sensing means for sensing the current, a chopper having a chopped output, and means for smoothing the output of the chopper and applying the output of the chopper to said spacing means, said chopper including only switches and passive elements;
    said chopper including a bridge having the switching elements, said bridge being responsive to the other component of power in the energy to be monitored and to said pulse width modulated signals for reversing the polarity of the other of the signals in dependence upon the momentary polarity of the pulse width modulated signals.

2. A device as in claim 1, wherein said spacing means includes an integrator and feedback means for feeding feedback signals from said pulse forming means to said integrator means, said integrator means being responsive to the output of said chopper means and the feedback signals for producing a ramp whose slope depends upon the output of said chopper means and initiating a pulse of predetermined time when the ramp reaches a predetermined value.

3. An energy meter for measuring energy as as function of power, comprising:
    pulse generating means for producing a pulse width modulated signal representing one component of power in the energy to be measured;
    chopper means responsive to another component of power in the energy to be measured for chopping the signals of the other component on the basis of the pulse width modulated signals and for smoothing the chopped signal;
    pulse forming means for producing a plurality of output pulses;
    spacing means coupled to said pulse forming means and said chopper means for spacing the output pulses of said pulse forming means in response to the output of said chopper means;
    counting means for counting the number of spaced pulses;
    said components being voltage and current;
    said chopper means including sensing means for sensing the current, a chopper having a chopped output, and means for smoothing the output of the chopper and applying the output of the chopper to said spacing means, said chopper including only switches and passive elements;
    said pulse generating means including triangle waveform forming means for forming triangle waveforms; and
    comparing means for comparing the one component of the power of the energy to be monitored with the triangle waveforms so as to produce a pulse stream whose pulses have durations based on the comparison of the one component and the waveform;
    said chopper including a bridge having the switching elements, said bridge being responsive to the other component of power in the energy to be monitored and to said pulse width modulated signals for reversing the polarity of the other of the signals in dependence upon the momentary polarity of the pulse width modulated signals.

4. A device as in claim 3, wherein said spacing means includes an integrator and feedback means for feeding feedback signals from said pulse forming means to said integrator means, said integrator means being responsive to the output of said chopper means and the feedback signals for producing a ramp whose slope depends upon the output of said chopper means and initiating a pulse of predetermined time when the ramp reaches a predetermined value.

5. An energy meter for measuring energy as as function of power, comprising:
    pulse generating means for producing a pulse width modulated signal representing one component of power in the energy to be measured;
    chopper means responsive to another component of power in the energy to be measured for chopping the signals of the other component on the basis of
the pulse width modulated signals and for smoothing the chopped signal;

pulse forming means for producing a plurality of output pulses;

spacing means coupled to said pulse forming means and said chopper means for spacing the output pulses of said pulse forming means in response to the output of said chopper means;

counting means for counting the number of spaced pulses;

said components being voltage and current;

said chopper means including sensing means for sensing the current, a chopper having a chopped output, and means for smoothing the output of the chopper and applying the output of the chopper to said spacing means, said chopper including only switches and passive elements;

said spacing means including an integrator and feedback means for feeding feedback signals from said pulse forming means to said integrator, said integrator being responsive to the output of said chopper means and the feedback signals for producing a ramp whose slope depends upon the output of said chopper means and initiating a pulse of predetermined time when the ramp reaches a predetermined value.

6. A device as in claim 5, wherein said integrator is an operational integrator.

7. An energy meter for measuring energy as as function of power, comprising:

pulse generating means for producing a pulse width modulated signal representing one component of power in the energy to be measured;

chopper means responsive to another component of power in the energy to be measured for chopping the signals of the other component on the basis of the pulse width modulated signals and for smoothing the chopped signal;

pulse forming means for producing a plurality of output pulses;

spacing means coupled to said pulse forming means and said chopper means for spacing the output pulses of said pulse forming means in response to the output of said chopper means;

counting means for counting the number of spaced pulses;

said components being voltage and current;

said chopper means including sensing means for sensing the current, a chopper having a chopped output, and means for smoothing the output of the chopper and applying the output of the chopper to said spacing means, said chopper including only switches and passive elements;

said pulse generating means including triangle waveform forming means for forming triangle waveforms; and comparing means for comparing the one component of the power of the energy to be monitored with the triangle waveforms so as to produce a pulse stream whose pulses have durations based on the comparison of the one component and the waveform;

said spacing means including an integrator and feedback means for feeding feedback signals from said pulse forming means to said integrator means, said integrator means being responsive to the output of said chopper means and the feedback signals for producing a ramp whose slope depends upon the output of said chopper means and initiating a pulse of predetermined time when the ramp reaches a predetermined value.

* * * * *